(12) United States Patent
Chiang

(10) Patent No.: US 6,545,287 B2
(45) Date of Patent: Apr. 8, 2003

(54) USING SELECTIVE DEPOSITION TO FORM PHASE-CHANGE MEMORY CELLS

(75) Inventor: Chien Chiang, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/948,874

(22) Filed: Sep. 7, 2001

(65) Prior Publication Data

US 2003/0047727 A1 Mar. 13, 2003

(51) Int. Cl.$^7$ .............................................. H01L 29/04
(52) U.S. Cl. .............................. 257/3; 257/2; 257/289; 438/900
(58) Field of Search .............................. 257/1–5, 289; 438/900

(56) References Cited

U.S. PATENT DOCUMENTS 5,536,947 A * 7/1996 Klersy et al. ................ 257/3
6,111,264 A * 8/2000 Wolstenholme et al. ....... 257/3

* cited by examiner

Primary Examiner—Nathan J. Flynn
Assistant Examiner—Scott R Wilson
(74) Attorney, Agent, or Firm—Trop, Pruner & Hu, P.C.

(57) ABSTRACT

A phase-change memory cell may be formed by selectively depositing the lower electrode in the phase-change memory pore. Thereafter, an adhesion-promoting material may be selectively deposited on the selectively deposited lower electrode and the upper surface surrounding the pore. Through the use of selective deposition techniques, the adhesion-promoting material can be positioned where needed and the lower electrode may be defined in a fashion that may reduce shunting current, reduce device current requirements, and increase dynamic range in some embodiments.

15 Claims, 5 Drawing Sheets

USING SELECTIVE DEPOSITION TO FORM PHASE-CHANGE MEMORY CELLS

BACKGROUND

This invention relates generally to electronic memories and particularly to electronic memories that use phase-change material.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally, any phase-change material may be utilized. In some embodiments, however, thin-film chalcogenide alloy materials may be particularly suitable.

The phase-change may be induced reversibly. Therefore, the memory may change from the amorphous to the crystalline state and may revert back to the amorphous state thereafter, or vice versa, in response to temperature changes. In effect, each memory cell may be thought of as a programmable resistor that reversibly changes between higher and lower resistance states. The phase-change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase-change alloys are known. Generally, chalcogenide alloys contain one or more elements from column VI of the periodic table. One particularly suitable group of alloys is GeSbTe alloys.

A phase-change material may be formed within a passage or pore through an insulator. The phase-change material may be coupled to upper and lower electrodes on either end of the pore.

Generally, the lower electrode is formed by a blanket deposition of an appropriate material. However, the use of a blanket deposition results in a lower electrode, extending across the length of the cell, that is capable of shunting the circuit and reducing the dynamic range of the memory cell. As a result, more current may be needed to heat the phase-change material to induce the phase-change.

Another problem relates to the adherence between the insulator defining the pore and the phase-change material. Because of the nature of these materials and the thermal cycling that they must endure, the adherence between the insulator and the phase-change material may be poor. One solution to this problem is to provide an interfacial layer that promotes adhesion between the insulator and the phase-change material. However, depositing the adhesion-promoting layer over silicon dioxide spacers may create adhesion problems as well. Therefore, the use of blanket deposition techniques to deposit the adhesion-promoting layer does not adequately promote adhesion of the phase-change material.

Thus, there is a need for better ways to deposit materials for forming phase-change memories.

DETAILED DESCRIPTION

Figure 1:
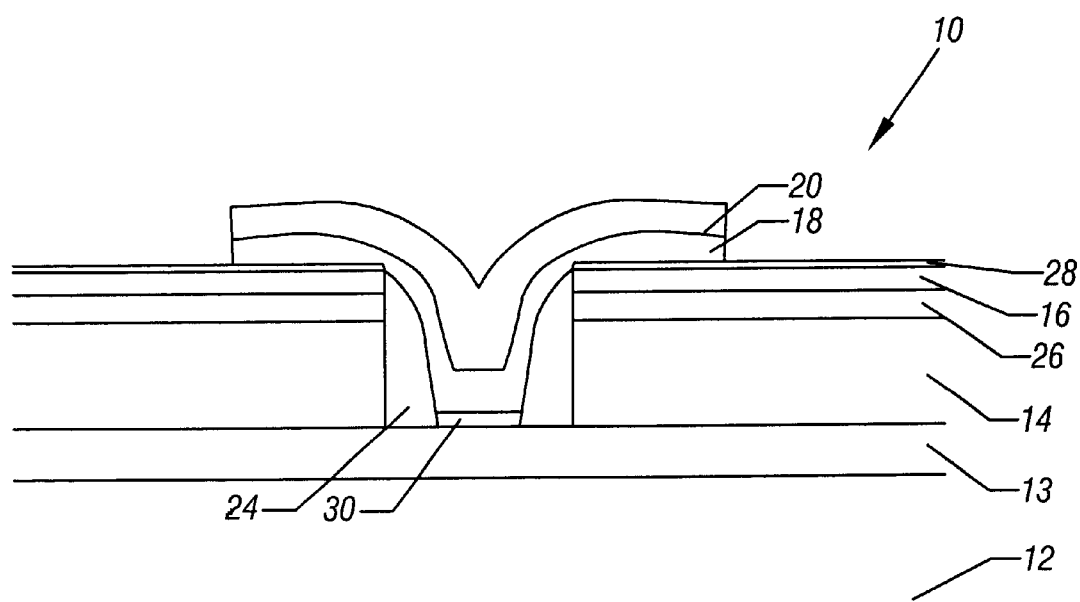
FIG. 1 is an enlarged, cross-sectional view of one embodiment of the present invention.

Referring to FIG. 1, a phase-change memory 10 may be formed on a semiconductor substrate 12 in accordance with one embodiment of the present invention. The substrate 12 may be covered with a lower electrode 13, in turn covered by a layer 14 of an insulating material such as silicon dioxide. The lower electrode 13 may be cobalt silicide as one example. In one embodiment, the layer 14 may in turn be covered by a second insulating layer 26, which is one embodiment may be silicon nitride.

The layer 16 may be covered by an adhesion-promoting layer 28 that is selectively deposited. A pore may be defined by a sidewall spacer 24 within the stack of layers 28, 16, 26, and 14. An adhesion-promoting layer 30 may be selectively deposited on the lower electrode 13. An upper electrode 20 may be defined over the phase-change material 18.

A phase-change material 18 may then be deposited so as to be adhered by the adhesion-promoting layers 30 and 28 over the lower electrode 22 and upper surface of the silicon layer 16. The adhesion-promoting layers 28 and 30 promote adhesion of the phase-change material 18 that may be formed of a chalcogenide alloy in one embodiment.

By selectively depositing the adhesion-promoting layers on the lower electrode 13 and the silicon layer 16, adhesion can be promoted in these advantageous regions. At the same time, coating the sidewall spacer 24 with an adhesion-promoting layer may be avoided. Such a conductive coating on the spacer 24 may result in shunting current around the phase-change material 18 and adversely affecting programming or reading of the memory 10.

Figure 2:
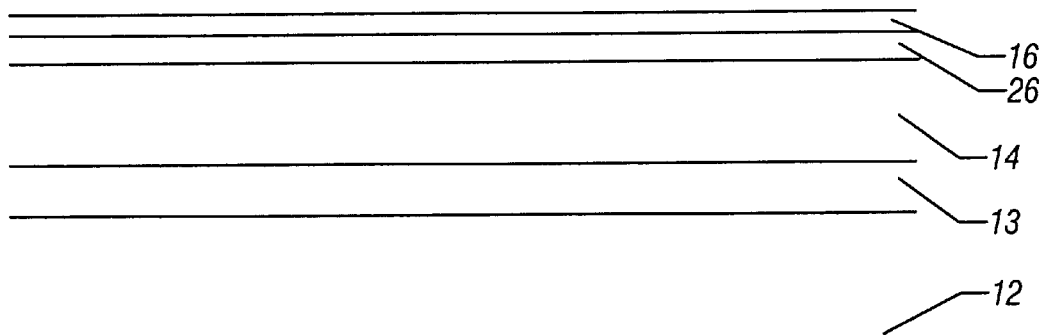
FIG. 2 is an enlarged, cross-sectional view of the embodiment shown in FIG. 1 at an initial stage of manufacturing in accordance with one embodiment of the present invention.
Figure 3:
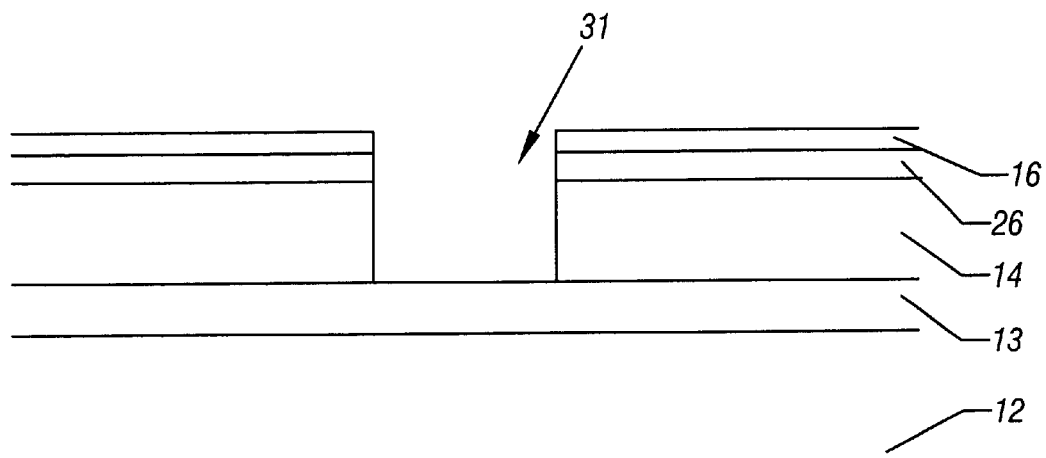
FIG. 3 is an enlarged, cross-sectional view of the embodiment shown in FIG. 2 at a subsequent stage of manufacturing in accordance with one embodiment of the present invention.

Referring to FIG. 2, initially a stack may be formed of a silicon substrate 12, covered by a lower electrode 13, a first insulating layer 14, a second insulating layer 26 and a silicon layer 16. In one embodiment, the layer 14 may be silicon dioxide and the layer 26 may be silicon nitride. A pore 31 may be defined by etching a passage down to the substrate 12 through the layers 16, 26, and 14 as shown in FIG. 3.

Figure 4:
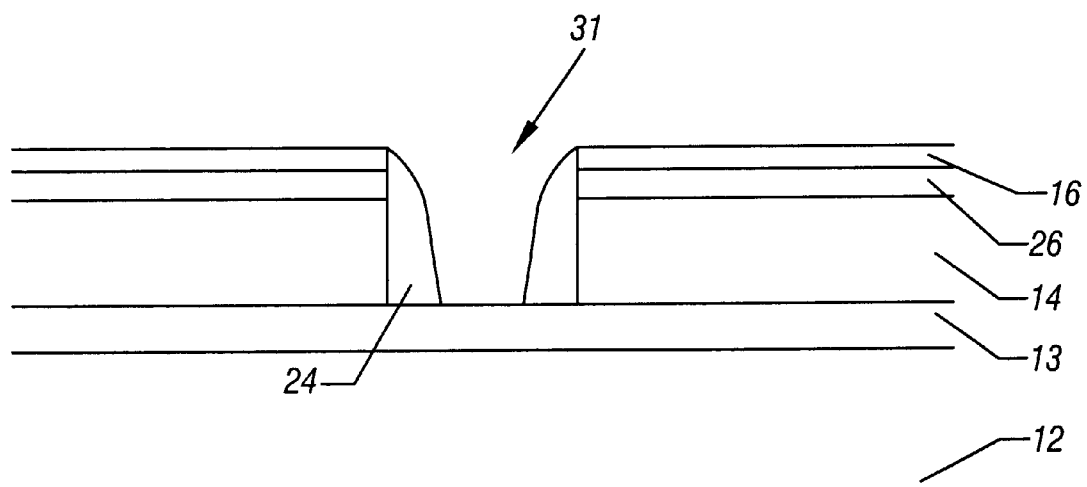
FIG. 4 is an enlarged, cross-sectional view of the embodiment shown in FIG. 3 at a subsequent stage of manufacturing in accordance with one embodiment of the present invention.

Then, as shown in FIG. 4, the sidewall spacer 24 may be formed within the resulting passage or pore 31. The sidewall spacer 24 may be formed by depositing an oxide material, for example, using a tetraethyl orthosilicate (TEOS) process. The deposited oxide is then anisotropically etched to create a cylindrical sidewall spacer 24 within the pore 31.

Figure 5:
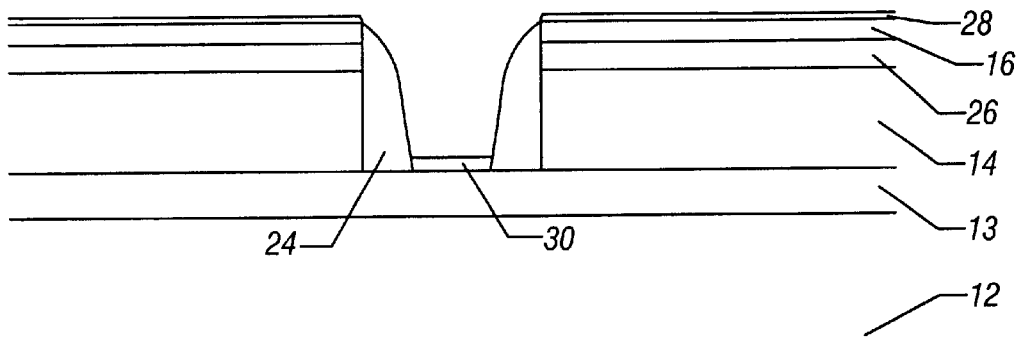
FIG. 5 is an enlarged, cross-sectional view of the embodiment shown in FIG. 4 at a subsequent stage of manufacturing in accordance with one embodiment of the present invention.

Referring to FIG. 5, the adhesion-promoting layer 30 may be selectively deposited over the electrode 13 and the adhesion-promoting layer 28 may be selectively deposited over the silicon layer 16. The adhesion-promoting layers 28 and 30 may be formed of titanium, aluminum, Tungsten, titanium nitride or silicon, to mention a few examples.

A selective chemical vapor deposition process may involve using a charge transfer mechanism to selectively deposit the conductive adhesion-promoting material, as indicated at 28 and 30, and to avoid depositing the adhesion-promoting material on the spacer 24. See e.g., U.S. Pat. No. 6,019,839 to Achutharaman, et al. A process gas mix including a silicon source gas is provided to a chemical vapor deposition chamber in the presence of a deposition gas of titanium tetrachloride. The deposition gas is thermally disassociated to form titanium and silicon atoms that combine to form an epitaxial film on conductive regions of the substrate 12, such as the layers 16 and 13. Thus, the titanium may be deposited on the conductive surfaces, such as the silicon layer 16 and the lower electrode 13, but the titanium is not significantly deposited on the spacer 24, which is formed of an insulator. As a result, a selective deposition process is achieved using electron exchange or charge transport.

Figure 6:
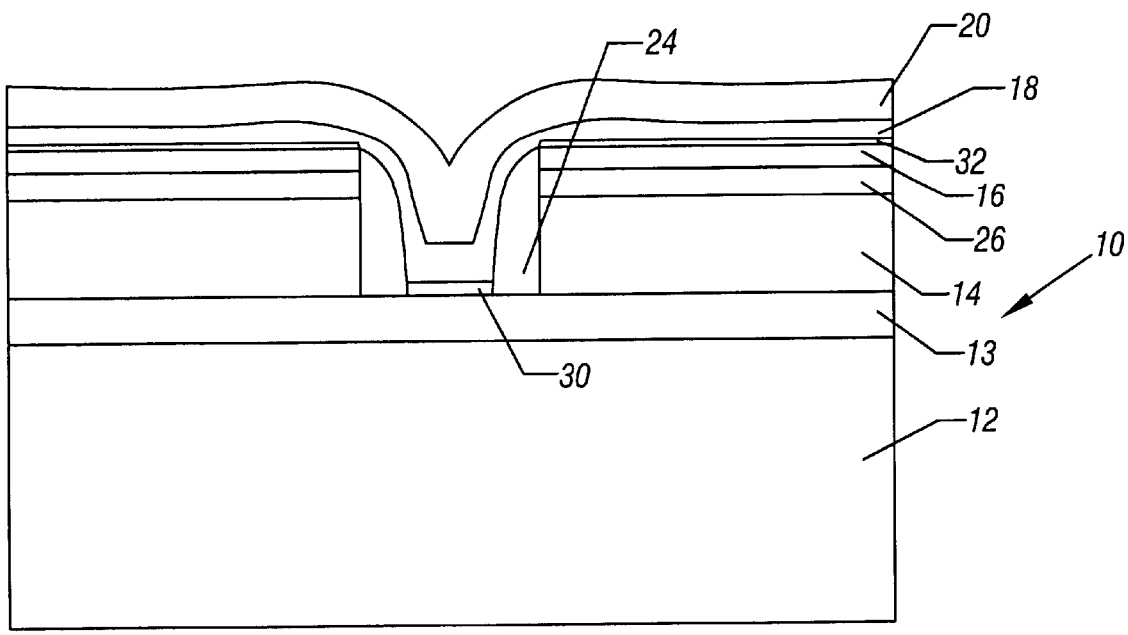
FIG. 6 is an enlarged, cross-sectional view of the embodiment shown in FIG. 5 at a subsequent stage of manufacturing in accordance with one embodiment of the present invention.

Referring to FIG. 6, a phase-change material 18 may be blanket deposited over the resulting structure. Likewise, an upper electrode 20 may be blanket deposited. In one embodiment, the upper electrode 20 may be a sandwich of titanium, titanium nitride and aluminum, in that order. The structure shown in FIG. 1 may be produced using conventional photolithographic techniques.

Figure 7:
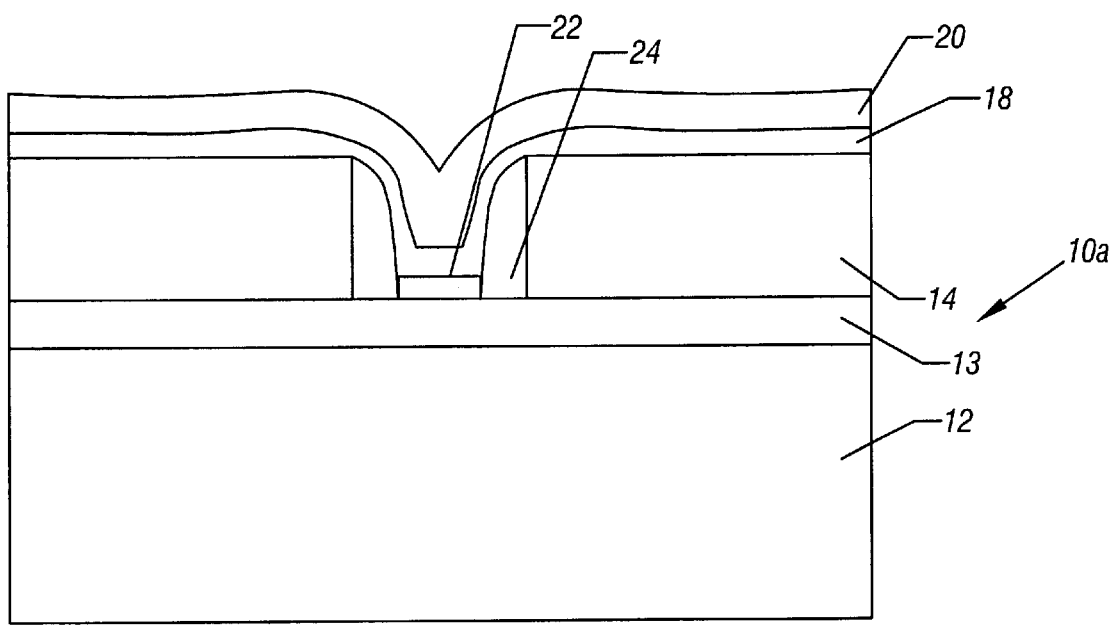
FIG. 7 is an enlarged, cross-sectional view of another embodiment of the present invention.

Referring to FIG. 7, in accordance with another embodiment of the present invention, a lower heater 22 may be selectively deposited. The lower heater 22 may be selectively deposited on the substrate 12 in the region defined by the spacer 24. By selectively depositing only on the substrate 12 and avoiding depositing the material on the sidewall spacer 24, ineffective heating of the phase-change material 18 may be avoided. Namely, if the heater 22 is deposited on both the substrate 12 and the spacer 24, the entire portion of the phase-change material 18 along the spacer 24 is heated. In fact, for effective operation of the memory 10a, it is more desirable that only the region at the interface between the lower electrode 13 and the phase-change material be heated.

In one embodiment, selective deposition of the lower heater 22 may be accomplished. Thus, the lower heater 22 may be formed of selectively deposited silicon, for example, by an epitaxial process. Alternatively, titanium nitride, titanium silicon carbide or carbon may be selectively deposited to form the heater 22, as additional examples.

In each case, the selectively deposited material is effective to cause electrical or resistance heating of the phase-change material. This heating is important to programming of the phase-change material 18, for example. Again, the selective deposition process takes advantage of the fact that the only exposed conductive material is the layer 13. As a result, the heater 22 is selectively deposited on the exposed portion of the layer 13, but not on any of the other structures. In particular, the insulator 26 does not provide for charge exchange and, therefore, the lower heater 22 is deposited neither on the spacer 24 nor on the insulator 26.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase-change memory comprising:
   a substrate;
   an insulating layer over said substrate;
   a passage formed through said insulating layer; and
   a selectively deposited lower electrode formed in said passage.

2. The memory of claim 1 including a silicon layer over said insulating layer.

3. The memory of claim 2 including an adhesion-promoting layer over said silicon layer.

4. The memory of claim 3 including a selectively deposited adhesion-promoting layer.

5. The memory of claim 1 including a sidewall spacer formed on said passage, said lower electrode being selectively deposited within said sidewall spacer.

6. The memory of claim 5 including an adhesion-promoting layer on said selectively deposited lower electrode.

7. The memory of claim 6 wherein said adhesion-promoting layer on said lower electrode is a selectively deposited adhesion-promoting layer.

8. The memory of claim 7 including a phase-change material deposited over said lower electrode.

9. The memory of claim 8 wherein said adhesion-promoting material promotes adhesion between said silicon layer and said phase-change material.

10. The memory of claim 9 wherein said adhesion-promoting material is a conductor.

11. A phase-change memory comprising:
    a substrate;
    an insulating layer over said substrate;
    a passage formed through said insulating layer; and
    a selectively deposited adhesion-promoting layer.

12. The memory of claim 11 including a silicon layer over said insulating layer, said adhesion-promoting layer over said silicon layer.

13. The memory of claim 11 including a selectively deposited lower electrode formed in said passage.

14. The memory of claim 13 wherein said adhesion-promoting layer is selectively deposited on said lower electrode.

15. The memory of claim 14 wherein said adhesion-promoting layer on said lower electrode is a conductive material.

* * * * *